United States Patent
Choi (10) Patent No.: US 7,352,218 B2
(45) Date of Patent: Apr. 1, 2008

(54) DLL CIRCUIT AND METHOD OF CONTROLLING THE SAME

(75) Inventor: Hoon Choi, Gyeonggi-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/637,757

(22) Filed: Dec. 13, 2006

(65) Prior Publication Data

US 2008/0001640 A1   Jan. 3, 2008

(30) Foreign Application Priority Data

Jun. 30, 2006   (KR) ............... 10-2006-0060484

(51) Int. Cl.
*H03L 7/06*   (2006.01)
(52) U.S. Cl. .................... 327/156; 327/147
(58) Field of Classification Search .......... None
See application file for complete search history.

(56) References Cited

U.S. PATENT DOCUMENTS

| | | | |
|---|---|---|---|
| 6,037,813 A * | 3/2000 | Eto et al. ............... 327/156 |
| 6,433,607 B2 * | 8/2002 | Kawasaki et al. ........... 327/299 |
| 6,525,578 B2 * | 2/2003 | Ooishi .................. 327/156 |
| 6,570,419 B2 * | 5/2003 | Hanzawa et al. .......... 327/152 |
| 6,650,594 B1 | 11/2003 | Lee et al. |
| 6,677,791 B2 * | 1/2004 | Okuda et al. ............. 327/158 |
| 6,724,228 B2 * | 4/2004 | Kashiwazaki ............ 327/158 |
| 6,836,437 B2 | 12/2004 | Li et al. |
| 6,954,094 B2 * | 10/2005 | Lee et al. ................ 327/158 |
| 6,998,903 B2 | 2/2006 | Jin |
| 7,015,737 B2 * | 3/2006 | Cho ..................... 327/158 |
| 7,046,061 B2 | 5/2006 | Kwak |
| 7,057,433 B2 * | 6/2006 | Cho et al. ............... 327/161 |
| 2004/0174760 A1 | 9/2004 | Lim et al. |
| 2005/0093599 A1 | 5/2005 | Kwak |
| 2006/0091939 A1 | 5/2006 | Do et al. |

FOREIGN PATENT DOCUMENTS

| | | |
|---|---|---|
| JP | 2005020686 | 1/2005 |
| KR | 1020020055910 | 7/2002 |
| KR | 1020040095965 | 11/2004 |

* cited by examiner

*Primary Examiner*—Cassandra Cox
(74) *Attorney, Agent, or Firm*—Venable, LLP; Jeffri A. Kaminski (57) ABSTRACT

A DLL circuit includes a buffer control unit configured to detect whether or not a DLL power supply exceeds a reference level and output a buffer control signal. A clock buffer buffers an external clock to generate an internal clock when the buffer control signal is enabled.

17 Claims, 5 Drawing Sheets

DLL CIRCUIT AND METHOD OF CONTROLLING THE SAME

BACKGROUND OF THE INVENTION

1. Technical Field

The present invention relates to a DLL (delay locked loop) circuit and a method of controlling the DLL circuit, and more specifically, to a DLL circuit which performs a stable operation regardless of variations in the voltage level of a DLL power supply, and to a method of controlling the same.

2. Related Art

In general, a DLL circuit is used to provide an internal clock having a phase which leads the phase of a reference clock obtained by converting an external clock by a predetermined amount of time. In general, the internal clock is generated so as to operate in synchronization with an external clock in a semiconductor memory apparatus, such as a synchronous dynamic random access memory (SDRAM) having a considerably high degree of integration.

More specifically, if an external clock is inputted into to a clock buffer, the clock buffer generates an internal clock. Then, the internal clock controls a data output buffer that outputs data. In this case, the internal clock is delayed by a predetermined amount of time from the external clock by the clock buffer, and output data from the data output buffer is also delayed by a predetermined amount of time from the internal clock. Therefore, the output data is considerably delayed.

In order to solve the above-mentioned problem, a DLL circuit is used to make the phase of the internal clock lead the phase of the external clock by a predetermined amount of time such that the output data is not delayed with reference to the external clock. That is, the DLL circuit receives an external clock and generates an internal clock having a phase which leads the phase of the external clock, and the internal clock is used as a reference clock in, for example, a data output buffer.

Hereinafter, a DLL circuit according to the related art will be described with reference to the accompanying drawing.

Figure 1:
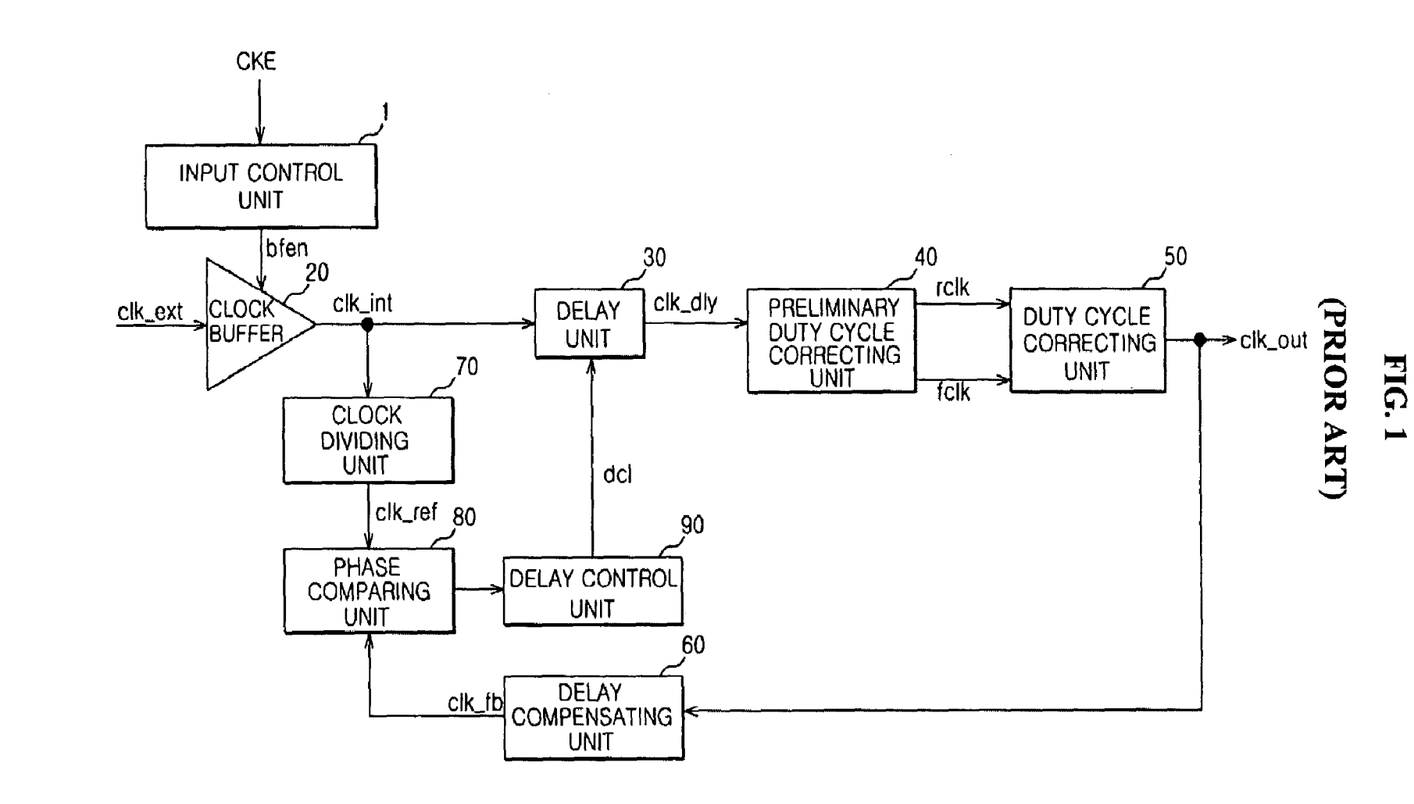
FIG. 1 is a block diagram illustrating the structure of a DLL circuit according to the related art.

FIG. 1 is a block diagram illustrating the structure of a DLL circuit according to the related art.

As illustrated in FIG. 1, the DLL circuit includes: an input control unit 1 for generating a buffer enable signal bfen from a clock enable command (hereinafter, signal CKE); a clock buffer 20 for buffering an external clock clk_ext according to the control of the buffer enable signal bfen so as to generate an internal clock clk_int; a delay unit 30 for delaying the internal clock clk_int in response to the input of a delay control signal dcl to generate a delayed clock clk_dly; a preliminary duty cycle correcting unit 40 for receiving the delayed clock clk_dly and dividing the delayed clock clk_dly into a rising clock rclk and a falling clock fclk; a duty cycle correcting unit 50 for correcting a falling edge time difference between the rising clock rclk and the falling clock fclk and generating an output clock clk_out; a delay compensating unit 60 for delaying the output clock clk_out to compensate for the delay time of the output clock clk_out caused by delay elements existing on a transfer path to the outside of a semiconductor integrated circuit, thereby generating a feedback clock clk_fb; a clock dividing unit 70 for dividing the frequency of the internal clock clk_int at a predetermined rate so as to generate a reference clock clk_ref; a phase comparing unit 80 for comparing the phase of the reference clock clk_ref with the phase of the feedback clock clk_fb; and a delay control unit 90 for generating the delay control signal dcl on the basis of the comparison result of the phase comparing unit 80, to control the delay time which is given to the internal clock clk_int by the delay unit 20.

In a semiconductor integrated circuit having the DLL circuit, in order to reduce power consumption, a power down mode is utilized to cut off the power supply to each region of the semiconductor integrated circuit. The operation of the clock buffer 20 during power down mode is controlled by input control unit 1. Input control unit 1 receives signal CKE and, as a result, generates buffer enable signal bfen. When the buffer enable signal bfen is received by the clock buffer 20 it outputs the internal clock clk_int. In the power down mode, the buffer enable signal bfen is disabled and the clock generating operation of the clock buffer 20 in the semiconductor integrated circuit having the DLL circuit stops.

Before the semiconductor integrated circuit having the DLL circuit enters the power down mode, a DLL power supply, which supplies voltage to each element of the DLL circuit, has a voltage level lower than an external power supply voltage. However, when the semiconductor integrated circuit having the DLL circuit enters the power down mode, the operation of each element stops and thus the whole load is reduced, which causes the voltage level of the DLL power supply to rise up to the level of the external power supply.

Figure 2:
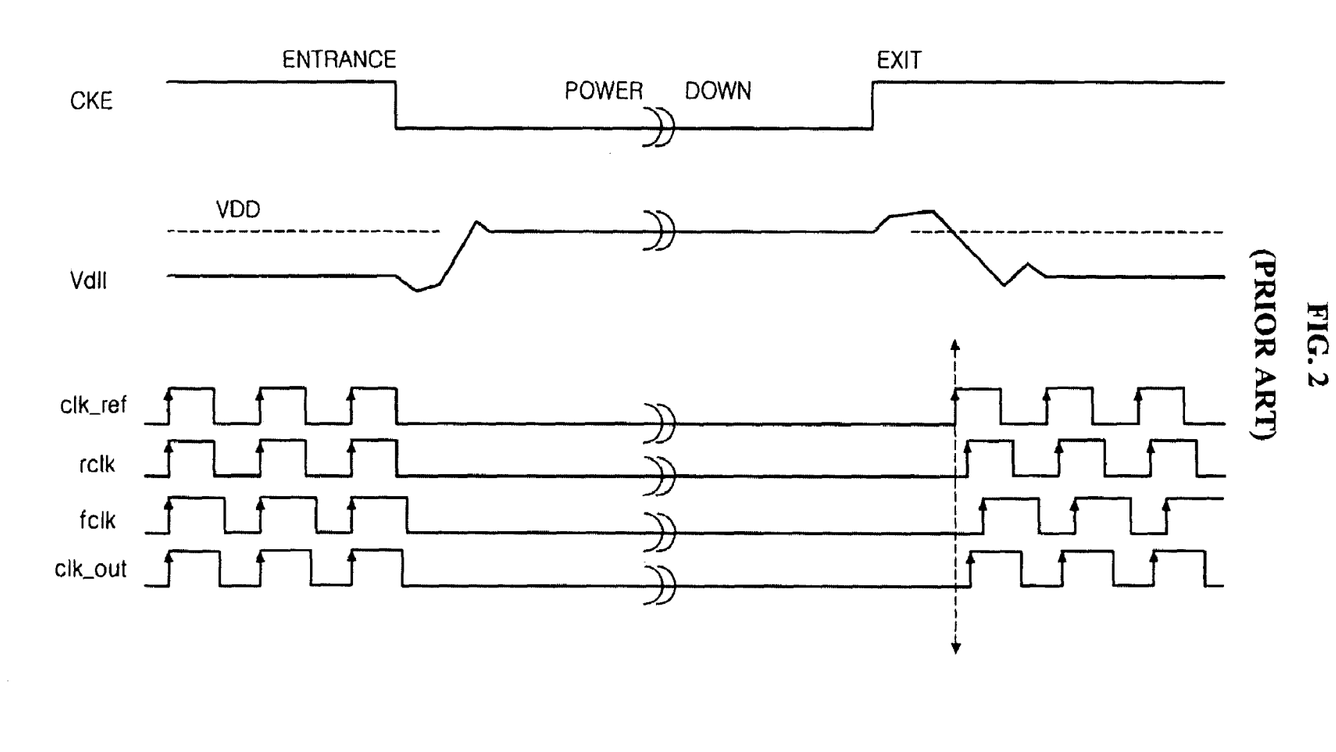
FIG. 2 is a timing chart that explains the operation of the DLL circuit according to the related art.

FIG. 2 is a timing chart that explains the operation of the DLL circuit according to the related art.

FIG. 2 shows a case in which, when the semiconductor integrated circuit having the DLL circuit enters the power down mode by receiving the signal CKE applied from the outside, the level of the DLL power supply Vdll rises. FIG. 2 also shows the reference clock clk_ref, the rising clock rclk, the falling clock fclk, and the output clock clk_out, which are locked by a delay locking operation of the DLL circuit. In this case, the rising clock rclk and the falling clock fclk are clocks that are output from the preliminary duty cycle correcting unit 40 and then input to the duty cycle correcting unit 50, and the output clock clk_out is a clock which the duty cycle correcting unit 50 outputs by correcting the duty cycles of the rising clock rclk and the falling clock fclk.

After the semiconductor integrated circuit having the DLL circuit enters the power down mode, the reference clock clk_ref, the rising clock rclk, the falling clock fclk, and the output clock clk_out are no longer generated by the DLL circuit. Whether the semiconductor integrated circuit enters the power down mode is determined, according to the buffer enable signal bfen output from the input control unit 1 operated by the signal CKE. The buffer enable signal bfen controls the operation of the clock buffer 20.

After the semiconductor integrated circuit exits the power down mode, the DLL circuit operates again to generate the reference clock clk_ref, the rising clock rclk, the falling clock fclk, and the output clock clk_out. When the semiconductor integrated circuit exits the power down mode, the DLL circuit starts to generate the clocks simultaneously. The voltage level of the DLL power supply Vdll rises as compared to a point in time when the voltage level of the DLL power supply Vdll is locked before the semiconductor integrated circuit enters the power down mode, and thus the delay values of the delay elements vary. Therefore, the variation causes an adverse effect in that the rising edge times of the reference clock clk_ref, the rising clock rclk, the falling clock fclk, and the output clock clk_out do not correctly correspond to one another.

As described above, the adverse effect occurring after the semiconductor integrated circuit exits the power down mode makes it difficult to correct a duty cycle of each clock and to set a clock locking reference point, thereby resulting in deterioration of the performance of the DLL circuit. In order to improve the performance of the DLL circuit, the above-mentioned malfunctions should be overcome, however, the related art has a technical limitation that cannot easily overcome the above-mentioned malfunctions.

SUMMARY OF THE INVENTION

Embodiments of the present invention provide a DLL circuit which stably performs a clock delay locking operation regardless of variations in the voltage level of a DLL power supply.

An embodiment of the present invention provides a DLL circuit including: a buffer control unit configured to detect whether or not a DLL power supply exceeds a reference level and output a buffer control signal; and a clock buffer configured to buffer an external clock to generate an internal clock when the buffer control signal is enabled.

Another embodiment of the present invention provides a DLL circuit including: a buffer control unit configured to control whether or not to output a buffer enable signal generated on the basis of a clock enable command according to whether or not a DLL power supply exceeds a reference level; and a clock buffer configured to buffer an external clock to generate an internal clock when the buffer enable signal is input.

Still another embodiment of the present invention provides a method of controlling a DLL circuit. The method includes: dividing an external power supply voltage to generate a divided voltage; comparing the voltage level of a DLL power supply with the voltage level of the divided voltage and controlling the output of a buffer enable signal on the basis of the comparison result; and buffering an external clock to generate an internal clock when the buffer enable signal is input.

DESCRIPTION OF EXEMPLARY EMBODIMENT

Embodiments of the present invention will now be described in detail with reference to the accompanying drawings.

Figure 3:
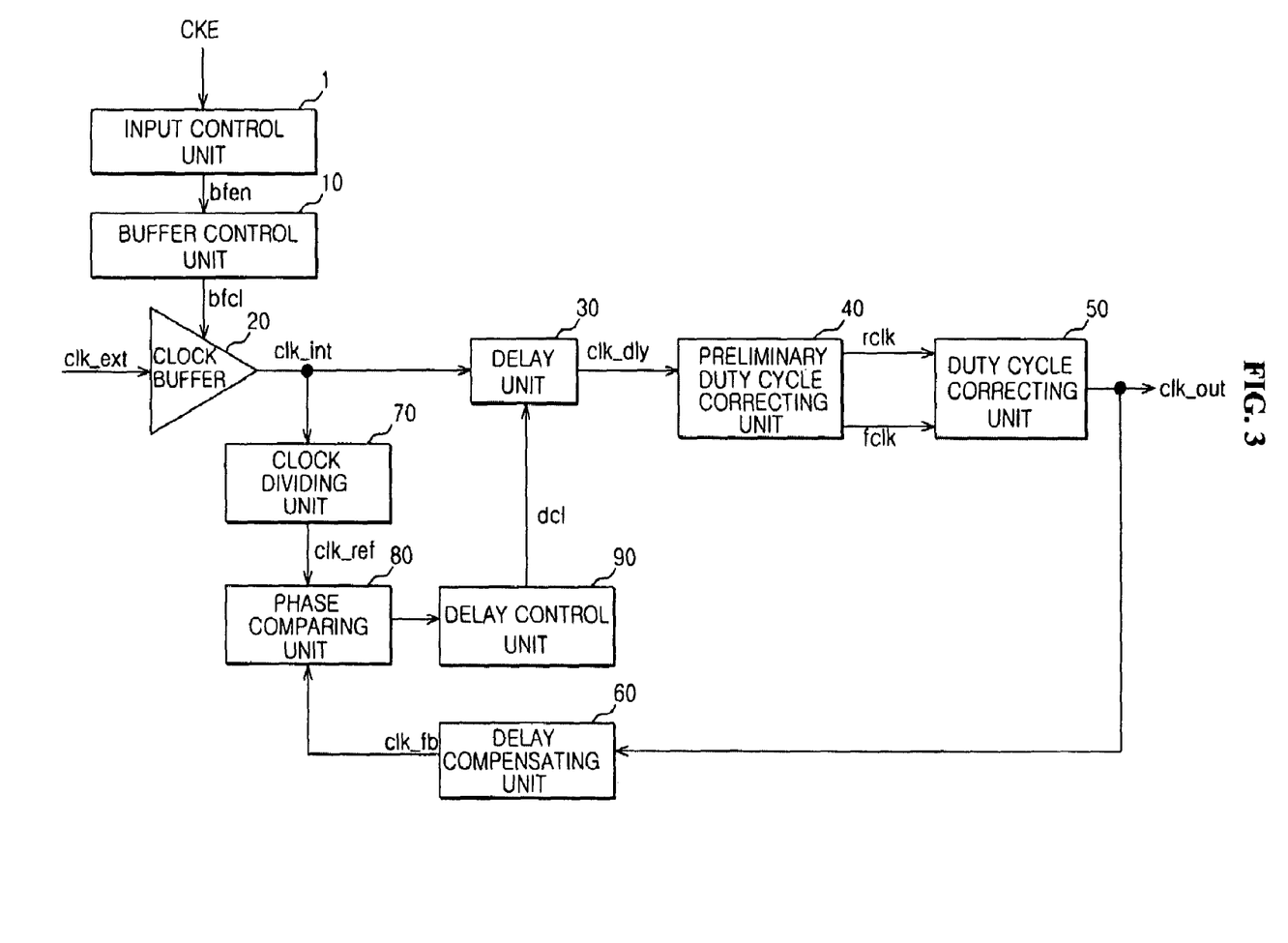
FIG. 3 is a block diagram illustrating the structure of a DLL circuit according to an embodiment of the present invention.

FIG. 3 is a block diagram illustrating the structure of a DLL circuit according to an embodiment of the present invention.

As shown in FIG. 3, the DLL circuit according to an embodiment of the present invention includes an input control unit 1, a buffer control unit 10, a clock buffer 20, a delay unit 30, a preliminary duty cycle correcting unit 40, a duty cycle correcting unit 50, a delay compensating unit 60, a clock dividing unit 70, a phase comparing unit 80, and a delay control unit 90.

The input control unit 1 generates a buffer enable signal bfen from a signal CKE.

The buffer control unit 10 controls the output of the buffer enable signal bfen as a buffer control signal bfcl according to whether or not a DLL power supply voltage Vdll exceeds a reference level.

The clock buffer 20 buffers an external clock clk_ext so as to generate an internal clock clk_int when the buffer control signal bfcl is enabled. If the buffer control is enabled and the external clock clk_ext is input to the clock buffer 20 from the outside of the DLL circuit, the clock buffer 20 converts the external clock clk_ext having a small amplitude into the internal clock clk_int having a large amplitude. The internal clock clk_int is then transmitted to the delay unit 30 and clock dividing unit 70.

The delay unit 30 delays the internal clock clk_int by the amount of time instructed by a delay control signal dcl and outputs the delayed internal clock as a delayed clock clk_dly.

The preliminary duty cycle correcting unit 40 receives the delayed clock clk_dly and divides the delayed clock clk_dly into a rising clock rclk and a falling clock fclk.

The duty cycle correcting unit 50 corrects the difference between the falling edge time of the rising clock rclk and the falling edge time of the falling clock fclk and generates an output clock clk_out.

The delay compensating unit 60 delays the output clock clk_out to correct the delay time of the output clock clk_out caused by delay elements existing on a transfer path to the outside of a semiconductor integrated circuit, thereby generates a feedback clock clk_fb. That is, the delay compensating unit 60 includes calculated delay values of the delay elements existing on an output path of the semiconductor integrated circuit having the DLL circuit. At that time, the output path is the path which the output clock clk_out generated from the duty cycle correcting unit 50 follows. Therefore, the delay compensating unit 60 gives the output clock clk_out a predetermined delay time for compensating the delay values of the delay elements to generate the feedback clock clk_fb.

The clock dividing unit 70 divides the frequency of the internal clock clk_int at a predetermined rate so as to generate a reference clock clk_ref.

The phase comparing unit 80 compares the phase of the reference clock clk_ref with the phase of the feedback clock clk_fb. Then, the phase comparing unit 80 transmits the comparison result to the delay control unit 90.

The delay control unit 90 generates the delay control signal dcl on the basis of the comparison result of the phase comparing unit 80, to control the delay time which is given to the internal clock clk_int by the delay unit 30.

In order for the DLL circuit to start to operate, the buffer control signal bfcl output from the buffer control unit 10 should be enabled such that the clock buffer 20 starts to operate. The buffer control signal bfcl is generated by the buffer control unit 10 in response to the buffer enable signal bfen. The buffer enable signal bfen is generated by the input control unit 1 in response to the signal CKE. Therefore, the buffer enable signal bfen and the buffer control signal bfcl have information on whether or not the semiconductor integrated circuit enters the power down mode. That is, if the semiconductor integrated circuit enters the power down mode, the buffer enable signal bfen is disabled. If the semiconductor integrated circuit exits the power down mode, the buffer enable signal bfen is enabled.

In this case, the buffer control unit 10 sets the reference level with respect to the DLL power supply voltage Vdll. If the DLL power supply voltage Vdll exceeds the reference level, the output of the buffer enable signal bfen is blocked and thus the buffer control signal bfcl is disabled. On the other hand, if the DLL power supply voltage Vdll does not exceed the reference level, the buffer enable signal bfen is output, and thus the buffer control signal bfcl is enabled.

Figure 4:
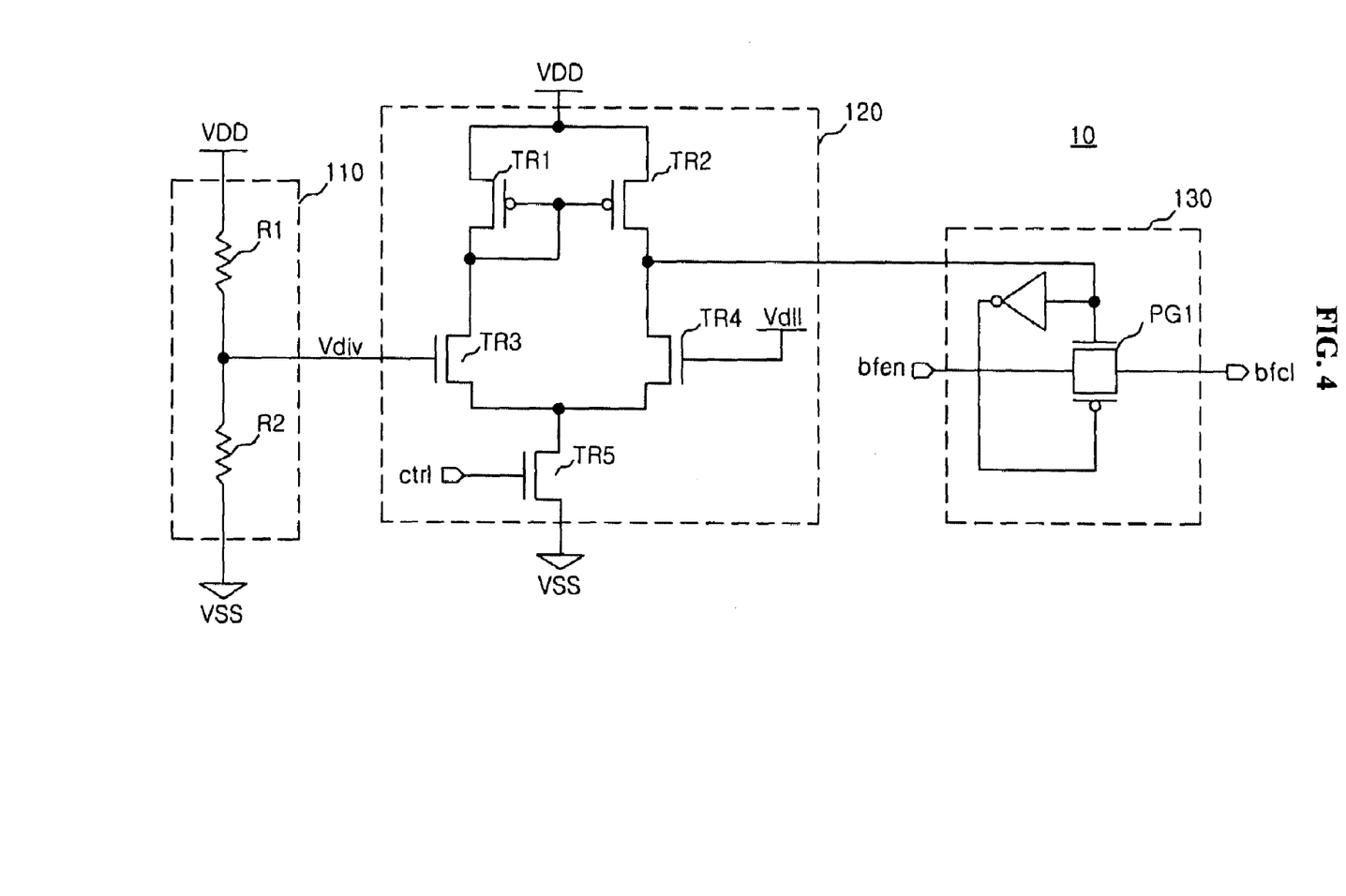
FIG. 4 is a circuit diagram illustrating the detailed structure of the buffer control unit illustrated in FIG. 3.

FIG. 4 is a circuit diagram illustrating the detailed structure of the buffer control unit 20 illustrated in FIG. 3.

The buffer control unit 10 includes: a voltage dividing section 110 for dividing the voltage of an external power supply VDD to generate a divided voltage Vdiv; a comparing section 120 for comparing the voltage level of the divided voltage Vdiv with the voltage level of the DLL power supply Vdll; and a switching section 130 for controlling the output of the buffer enable signal bfen as the buffer control signal bfcl on the basis of the comparison result of the comparing unit 120.

In the buffer control unit 10, the voltage dividing section 110 includes first and second resistors R1 and R2 for dividing the voltage of the external power supply VDD at a resistance ratio of the first resistor R1 to the second resistor R2. This creates a divided voltage Vdiv which is used as a reference level in the comparing section 120. In this case, the voltage level of the generated divided voltage Vdiv is used as the reference level of the DLL power supply Vdll.

The comparing section 120 is operated by a control signal ctrl and includes five transistors TR1 to TR5 realized in the form of a differential amplifier for comparing the reference level of the divided voltage Vdiv with the voltage level to the DLL power supply Vdll.

The switching section 130 includes a pass gate PG that outputs the buffer enable signal bfen as the buffer control signal bfcl according to the control of an output signal of the comparing section 120.

The divided voltage Vdiv for the most stable operation of the DLL circuit may be determined through a test, as known to one of ordinary skill in the art, and depends on the resistance ratio of the first resistor R1 to the second resistor R2.

When the voltage level of the DLL power supply Vdll is higher than the reference level, the output signal of the comparing section 120 becomes a low level. Accordingly, the pass gate PG of the switching section 130 is turned off and the output of the buffer enable signal bfen is blocked, which causes the buffer control signal bfcl to be disabled.

On the other hand, when the voltage level of the divided voltage Vdiv is higher than the level of the DLL power supply Vdll, the output signal of the comparing unit 120 becomes a high level. Accordingly, the pass gate PG of the switching section 130 is turned on, and the buffer enable signal bfen is output as the buffer control signal bfcl.

Figure 5:
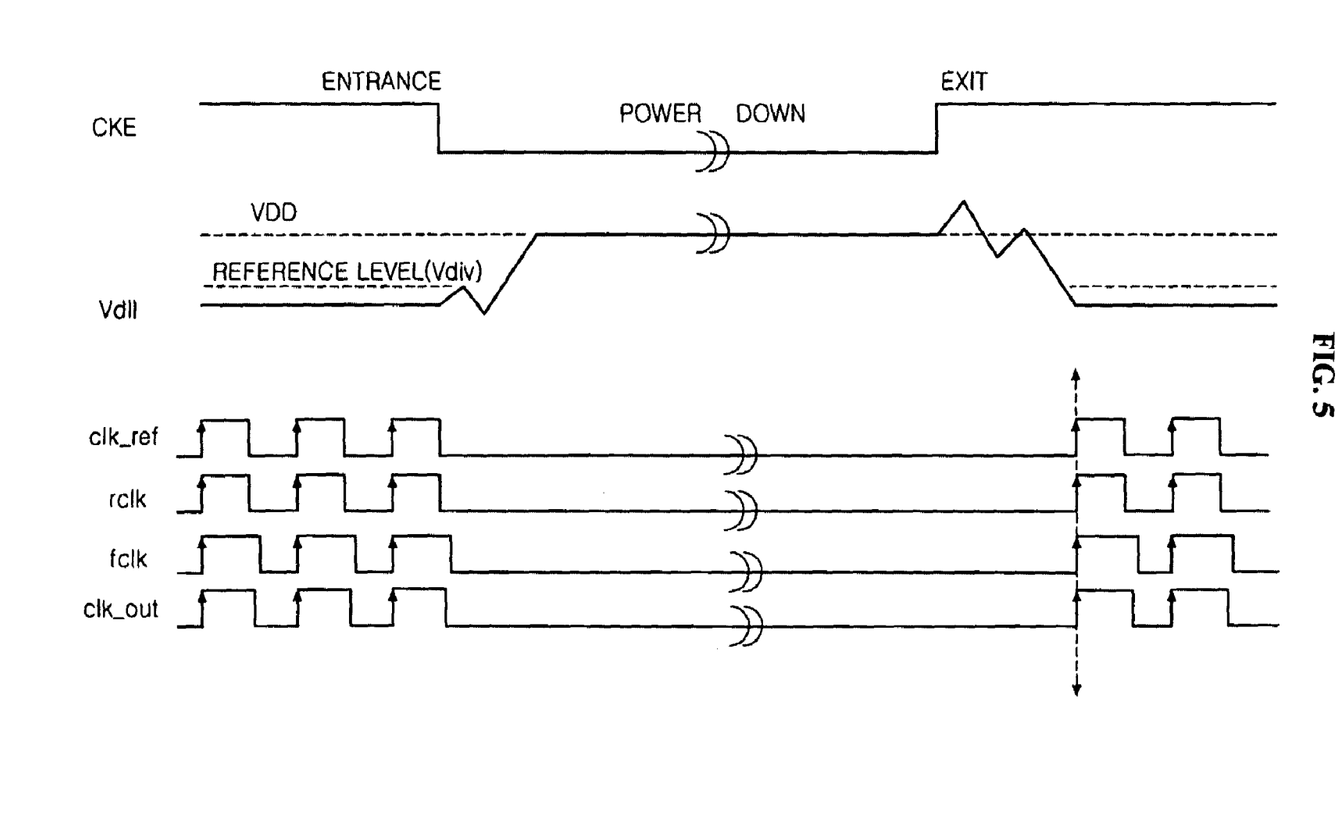
FIG. 5 is a timing chart that explains the operation of the DLL circuit according to the embodiment of the present invention.

FIG. 5 is a timing chart that explains the operation of the DLL according to an embodiment of the present invention.

FIG. 5 shows a case in which, after the semiconductor integrated circuit having the DLL circuit enters the power down mode in response to the signal CKE applied from the outside, the level of the DLL power supply Vdll rises. FIG. 5 also shows the reference clock clk_ref, the rising clock rclk, the falling clock fclk, and the output clock clk_out which are locked by a delay locking operation of the DLL circuit.

After the semiconductor integrated circuit enters the power down mode, the reference clock clk_ref, the rising clock rclk, the falling clock fclk, and the output clock clk_out are not generated by the DLL circuit any more. This is because, in the power down mode, the buffer enable signal bfen output from the input control unit 1 is disabled and thus the buffer control signal bfcl output from the buffer control signal 10 is disabled, which causes the operation of the clock buffer 20 to stop.

After the semiconductor integrated circuit exits the power down mode, the voltage level of the DLL power supply Vdll starts to drop. In this case, the buffer enable signal bfen output from the input control unit 1 is enabled. Meanwhile, the buffer control unit 10 blocks the output of the buffer enable signal bfen so as to disable the buffer control signal bfcl until a point in time when the level of the DLL power supply Vdll drops below the reference level. Thereafter, when the DLL voltage Vdll drops below the reference level, the buffer enable signal bfen is output and thus the buffer control signal bfcl is enabled. As the enabled buffer control signal bfcl is input to the clock buffer 20, the clock delay locking operation of the DLL circuit starts again. In this case, the reference level of the DLL power supply Vdll is set to the voltage level of the divided voltage Vdiv generated by the buffer control unit 10.

In order to prevent a disadvantageous situation in which the rising edge times of clocks do not correspond to one another due to change the pre-locked delay value of the delay elements when the semiconductor integrated circuit exits the power down mode and thus the rising edge times of the clocks do not correspond to one another the reference level can be adjusted. For example, the reference level may be set such that the point in time when the DLL circuit starts to operate again is delayed until the DLL power supply Vdll drops below the reference level. By this operation, each delay element in DLL circuit restores its delay value which it had before the semiconductor integrated circuit having a DLL circuit enters the power down mode. Accordingly, the rising edge times of the reference clock clk_ref, the rising clock rclk, the falling clock fclk, and the output clock clk_out can exactly correspond to each another.

As described above, in order to prevent the adverse effect of the level of the DLL power supply rising when the semiconductor integrated circuit exits the power down mode, which causes the delay values of the delay elements to vary, when the semiconductor integrated circuit exits the power down mode, the DLL circuit according to an embodiment of the present invention sets the reference level with respect to the DLL power supply. When the level of the DLL power supply is lower than the reference level, the DLL circuit operates. In order for this operation, when the DLL power supply is equal to or higher than the reference level, the output of the buffer enable signal is blocked and thus the buffer control signal is disabled which stops the operation of the clock buffer. On the other hand, when the DLL power supply is lower than the reference level, the buffer enable signal is output and thus the buffer control signal is enabled which allows the clock buffer to operate. In this case, the reference level is set by the designer, to a level at which the DLL circuit stably operates, through a test. Therefore, the duty cycle correcting operation and the clock locking reference point setting operation are more accurately performed, thereby improving the performance of the DLL circuit.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

According to the DLL circuit and the method of controlling the same according to the above-described embodiment of the present invention, it is possible to stably perform the clock delay locking operation regardless of variations in the voltage level of the DLL power supply by setting the reference level, determining whether or not to enable the buffer control signal according to whether or not the DLL power supply voltage exceeds the reference level, and controlling the operation of the clock buffer according to the determination result.

Further, the DLL circuit and the method of controlling the same according to the above-mentioned embodiment of invention, makes it possible to stably perform the clock delay locking operation by ensuring delay elements maintain pre-locked delay values, which the delay elements have before a semiconductor integrated circuit enters a power down mode, even after the semiconductor integrated circuit exits the power down mode.

What is claimed is:

1. A DLL (Delay Locked Loop) circuit comprising:
    a buffer control unit configured to detect whether or not a voltage level of the DLL power supply exceeds a reference level and enable a buffer control signal; and
    a clock buffer configured to buffer an external clock to generate an internal clock when the buffer control signal is enabled.

2. The DLL circuit of claim 1,
    wherein the buffer control signal is enabled on the basis of a buffer enable signal, and
    the buffer enable signal is generated by a clock enable command, is disabled when a semiconductor integrated circuit having the DLL circuit enters a power down mode, and is enabled when the semiconductor integrated circuit having the DLL circuit exits the power down mode.

3. The DLL circuit of claim 1,
    wherein the reference level with respect to the DLL power supply is set to a level for restoring pre-locked delay values of delay elements when the semiconductor integrated circuit exits the power down mode.

4. The DLL circuit of claim 2,
    wherein the buffer control unit comprises:
    a voltage dividing section configured to divide a voltage of an external power supply to generate a divided voltage;
    a comparing section configured to compare the divided voltage to the voltage level of the DLL power supply and generate a comparison result; and
    a switching section configured to control output of the buffer enable signal as the buffer control signal on the basis of the comparison result of the comparing section.

5. The DLL circuit of claim 4,
    wherein the voltage dividing section comprises a first and a second resistor at a resistance ratio of the first resistor to the second resistor,
    the voltage of the external power supply is divided by the resistance ratio to generate a divided voltage, and
    the generated divided voltage is used as the reference level with respect to the DLL power supply.

6. The DLL circuit of claim 4,
    wherein the comparing section is operated by a control signal and comprises a differential amplifier configured to compare the divided voltage with the voltage level of the DLL power supply.

7. The DLL circuit of claim 4,
    wherein the switching section comprises a pass gate configured to pass the buffer enable signal according to the control of the comparison result of the comparing section.

8. A DLL (Delay Locked Loop) circuit comprising;
    a buffer control unit configured to control whether or not to output a buffer enable signal generated on the basis of a clock enable command according to whether or not a voltage level of a DLL power supply exceeds a reference level; and
    a clock buffer configured to buffer an external clock to generate an internal clock when the buffer enable signal is input to the clock buffer.

9. The DLL circuit of claim 8,
    wherein the buffer enable signal is disabled when a semiconductor integrated circuit having the DLL circuit enters a power down mode, and is enabled when the semiconductor integrated circuit having the DLL circuit exits the power down mode.

10. The DLL circuit of claim 8,
    wherein the reference level with respect to the DLL power supply is set to a level for restoring pre-locked delay values of delay elements when a semiconductor integrated circuit having the DLL circuit exits a power down mode.

11. The DLL circuit of claim 9,
    wherein the buffer control unit comprises:
    a voltage dividing section configured to divide a voltage of an external power supply to generate a divided voltage;
    a comparing section configured to compare the divided voltage with the voltage level of the DLL power supply to generate a comparison result; and
    a switching section configured to output the buffer enable signal as the buffer control signal on the basis of the comparison result of the comparing section.

12. The DLL circuit of claim 11,
    wherein the voltage dividing section comprises first and second resistors for dividing the voltage of the external power supply at a resistance ratio of the first resistor to the second resistor to generate the divided voltage, and
    the divided voltage is used as the reference level with respect to the DLL power supply.

13. The DLL circuit of claim 11,
    wherein the comparing section is operated by a control signal and comprises a differential amplifier configured to compare the divided voltage with the voltage level of the DLL power supply.

14. The DLL circuit of claim 11,
    wherein the switching section comprises a pass gate configured to pass the buffer enable signal according to control of the comparison result of the comparing section.

15. A method of controlling a DLL (Delay Locked Loop) circuit, comprising:
    dividing an external power supply voltage to generate a divided voltage;
    comparing the voltage level of a DLL power supply with a voltage level of the divided voltage and controlling output of a buffer enable signal based on the comparison; and buffering an external clock to generate an internal clock when the buffer enable signal is input.

16. The method of controlling a DLL circuit of claim 15, wherein the buffer enable signal is generated by a clock enable command, is disabled when a semiconductor integrated circuit having the DLL circuit enters a power down mode, and is enabled when the semiconductor integrated circuit exists the power down mode.

17. The method of controlling a DLL circuit of claim 15, wherein the level of the divided voltage is set to a reference level with respect to the DLL power supply for restoring pre-locked delay values of delay elements when a semiconductor integrated circuit having the DLL circuit exists a power down mode.

* * * * *